US006693975B2

(12) United States Patent
Halder

(10) Patent No.: US 6,693,975 B2
(45) Date of Patent: Feb. 17, 2004

(54) LOW-ORDER HDSL2 TRANSMIT FILTER

(75) Inventor: Bijit Halder, Mountain View, CA (US)

(73) Assignee: Virata Corporation, Cupertino, CA (US)

( * ) Notice: Subject to any disclaimer, the term of this patent is extended or adjusted under 35 U.S.C. 154(b) by 435 days.

(21) Appl. No.: 09/770,829

(22) Filed: Jan. 26, 2001

(65) Prior Publication Data

US 2002/0136323 A1 Sep. 26, 2002

(51) Int. Cl.[7] .............................................. H04L 25/49
(52) U.S. Cl. ........................................ 375/297; 708/426
(58) Field of Search ................................ 375/219, 222, 375/227, 295, 296, 297; 332/123, 124, 159, 160; 455/115.1, 127.1; 708/426

(56) References Cited

U.S. PATENT DOCUMENTS

| | | |
|---|---|---|
| 4,606,027 A | 8/1986 | Otani |
| 5,062,102 A | 10/1991 | Taguchi |
| 5,220,570 A | 6/1993 | Lou et al. |
| 5,357,257 A | 10/1994 | Nevin |
| 5,457,705 A | 10/1995 | Todoroki |
| 5,502,736 A | 3/1996 | Todoroki |
| 5,509,021 A | 4/1996 | Todoroki |
| 5,751,734 A | 5/1998 | Choi et al. |
| 5,796,756 A | 8/1998 | Choi et al. |
| 5,838,729 A | 11/1998 | Hu et al. |
| 5,909,426 A | 6/1999 | Liau et al. |
| 5,915,235 A | 6/1999 | DeJaco et al. |
| 5,928,378 A | 7/1999 | Choi |
| 5,946,361 A | 8/1999 | Araki et al. |
| 5,970,104 A | 10/1999 | Zhong et al. |
| 5,995,562 A | 11/1999 | Koizumi |
| 6,067,327 A * | 5/2000 | Creigh et al. ............. 375/295 |
| 6,353,604 B2 * | 3/2002 | Grimwood et al. ......... 370/335 |
| 6,463,110 B1 * | 10/2002 | Rinderknecht et al. ..... 375/355 |

OTHER PUBLICATIONS

Chen, Xiangkun, et al., "Design of Optimal Minimum Phase for Filters by Direct Factorization", Signal Processing, 10 (1986) 369–383, North–Holland.

Falconer, David D. and Ljung, Lennart, "Application of Fast Kalman Estimation to Adaptive Equalization," IEEE Trans. on Comm., COM–26, No. 10 (Oct. 1978).

Gitlin, Richard D; Hayes, Jeremiah F.; and Weinstein, Stephen B., "Data Communications Principles," Chapter 8, p. 591 (1992).

Wu, Shao–Po; Boyd, Stephen; and Vandenberghe, Lieven, "FIR Filter Design via Spectral Factorization and Convex Optimization," Chapter 1, Applied Computational Control, Signal and Communications (1997).

* cited by examiner

Primary Examiner—Young T. Tse
(74) Attorney, Agent, or Firm—Burns, Doane, Swecker & Mathis, L.L.P.

(57) ABSTRACT

The present invention comprises a method of obtaining coefficients for a transmit filter such that the power spectral density of the output for the different frequencies comes close to but does not exceed a maximum power spectral density of a communication(s) standard. By first doing a convex optimization procedure to obtain the autocorrelation coefficients for the filter and then using the autocorrelation coefficients to determine the filter coefficients, a low-order filter that closely approximates the desired output power spectral densities can be produced.

16 Claims, 8 Drawing Sheets

| Up-stream | | Down-stream | |
|---|---|---|---|
| Frequency (kHz) | Maximum Power (dBm/Hz) | Frequency (kHz) | Maximum Power (dBm/Hz) |
| ≤1 | −54.2 | ≤1 | −54.2 |
| 2 | −42.1 | 2 | −42.2 |
| 10 | −37.8 | 12 | −39.2 |
| 175 | −37.8 | 190 | −39.2 |
| 220 | −34.4 | 236 | −46.2 |
| 255 | −34.4 | 280 | −35.7 |
| 276 | −41.1 | 375 | −35.7 |
| 300 | −77.6 | 400 | −40.2 |
| 555 | −102.6 | 440 | −68.2 |
| 800 | −105.6 | 600 | −76.2 |
| 1400 | −108 | 1000 | −89.2 |
| ≥2000 | −108 | 2000 | −99.7 |
| | | ≥3000 | −108 |

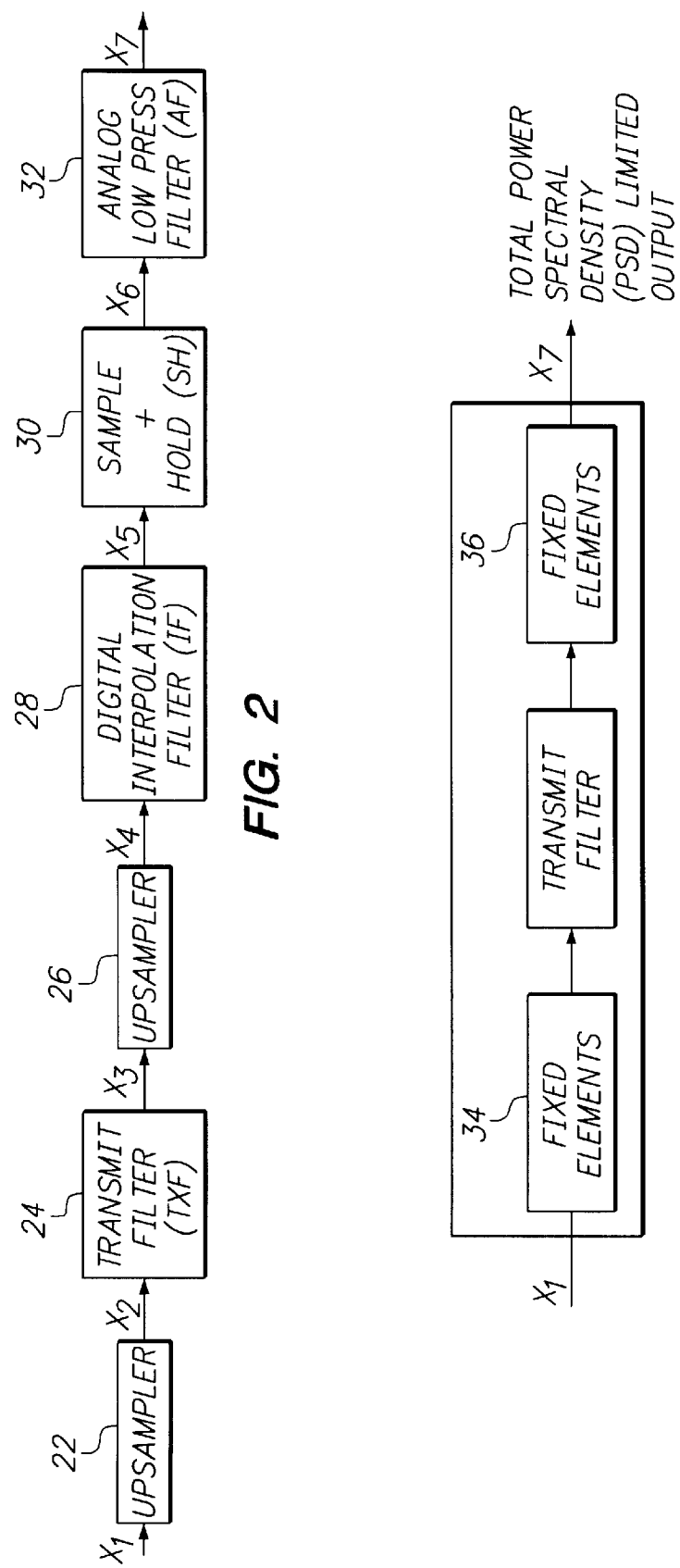

$$F \triangleq \begin{bmatrix} 1 & 2\cos(2\pi f_0 T_2) & 2\cos(2\pi f_0 2T_2) & \cdots & 2\cos(2\pi f_0(N_{tap}-1)T_2) \\ 1 & 2\cos(2\pi f_1 T_2) & 2\cos(2\pi f_1 2T_2) & \cdots & 2\cos(2\pi f_1(N_{tap}-1)T_2) \\ 1 & 2\cos(2\pi f_2 T_2) & 2\cos(2\pi f_2 2T_2) & \cdots & 2\cos(2\pi f_2(N_{tap}-1)T_2) \\ \vdots & \vdots & \vdots & \cdots & \vdots \\ 1 & 2\cos(2\pi f_{N-1} T_2) & 2\cos(2\pi f_{N-1} 2T_2) & \cdots & 2\cos(2\pi f_{N-1}(N_{tap}-1)T_2) \end{bmatrix}$$

$$W \triangleq \begin{bmatrix} [W(f_0)]^2 & \cdots & 0 \\ \vdots & \ddots & \vdots \\ 0 & \cdots & [W(f_{N-1})]^2 \end{bmatrix},$$

$$s \triangleq \begin{bmatrix} S_{max}(f_0) \\ S_{max}(f_1) \\ S_{max}(f_2) \\ \vdots \\ S_{max}(f_{N-1}) \end{bmatrix}, \quad c \triangleq \begin{bmatrix} -1 \\ 0 \\ 0 \\ \vdots \\ 0 \end{bmatrix}$$

Using these matrices, we write the optimization problem as a LP where $\min_{r} c^T r$, subject to $Ar \leq b$, $A \triangleq \begin{bmatrix} WF \\ -WF \end{bmatrix}$, $b \triangleq \begin{bmatrix} s \\ 0 \end{bmatrix}$,

*FIG. 5*

| Up-stream | | Down-Stream | |
|---|---|---|---|
| $n$ | $h(nT_2)$ | $n$ | $h(nT_2)$ |
| 0 | 4.709427e+005 | 0 | 2.076339e+006 |
| 1 | 9.392642e+005 | 1 | 4.633435e+005 |
| 2 | 7.441024e+005 | 2 | -1.363275e+006 |
| 3 | -3.102896e+005 | 3 | 9.692316e+005 |
| 4 | -8.491730e+005 | 4 | -4.505308e+004 |
| 5 | -2.111427e+005 | 5 | -1.435583e+006 |
| 6 | 5.546201e+005 | 6 | 1.043916e+006 |
| 7 | 1.513492e+005 | 7 | -2.813966e+003 |
| 8 | -6.044416e+005 | 8 | -6.845428e+005 |
| 9 | -3.969711e+005 | 9 | 2.805724e+005 |
| 10 | 3.571112e+005 | 10 | -3.168294e+005 |
| 11 | 2.736083e+005 | 11 | 1.111972e+005 |
| 12 | -3.742173e+005 | 12 | 6.951849e+004 |
| 13 | -3.853033e+005 | 13 | -4.369879e+005 |
| 14 | 1.796320e+005 | 14 | 2.208127e+005 |
| 15 | 2.275764e+005 | 15 | -1.005675e+005 |
| 16 | -2.065247e+005 | 16 | -1.747965e+005 |
| 17 | -2.600809e+005 | 17 | 1.198881e+005 |
| 18 | 9.442485e+004 | 18 | -1.421865e+005 |
| 19 | 1.271331e+005 | 19 | -2.248368e+004 |
| 20 | -1.352545e+005 | 20 | -1.471690e+004 |
| 21 | -1.473337e+005 | 21 | -1.002465e+005 |
| 22 | 7.673862e+004 | 22 | 6.203943e+004 |
| 23 | 6.556446e+004 | 23 | -8.127091e+004 |
| 24 | -9.282834e+004 | 24 | -4.409450e+004 |
| 25 | -9.028144e+004 | 25 | 2.987768e+004 |
| 26 | 6.389245e+004 | 26 | -5.393005e+004 |
| 27 | 2.889806e+004 | 27 | -1.511058e+004 |
| 28 | -3.289577e+004 | 28 | -1.467087e+004 |
| 29 | -6.733457e+004 | 29 | -6.617383e+003 |
| 30 | 5.246318e+004 | 30 | 2.223344e+003 |
| 31 | 1.005639e+004 | 31 | -3.380270e+004 |

*FIG. 10*

LOW-ORDER HDSL2 TRANSMIT FILTER

BACKGROUND OF THE INVENTION

The present invention relates to a transmit filter for high-bit-rate digital subscriber line (HDSL2 systems). The HDSL2 standard (currently, Draft HDSL2 Standard, T1E1. 4/2000-006, ANSI) requires both the upstream and the downstream transmitted power spectrum densities (PSDs) to be below a certain level. Such transmitted power specifications are standard on present and future communication systems. It is desired to have a transmit power that comes close to but does not exceed the maximum allowable power at any frequency. Because the specification is relatively complex, it is difficult to come up with a low-order filter that allows the system to approach the maximum allowed power output.

Additionally, transmit filters which are produced using conventional methods to approach the maximum PSDs for the different frequencies of the HDSL2 specification tend to be quite complex having coefficients into the hundreds. This becomes quite difficult to implement in a realistic system. Typically, less accurate lower-order filters are used, giving up some of the allowed power spectrum density at certain frequencies.

It is desired to have an improved transmit filter and method for calculating transmit filter coefficients.

SUMMARY OF THE PRESENT INVENTION

This invention describes a two-step procedure for the design of transmit filter for the communication system with maximum allowable power spectral density. First, the relevant section of the transmit path is partitioned into two parts: (i) the transmit filter that needs to be designed, and ii) the remaining elements that affect the output but not part of the transmit filter, modeled as a fixed weighting function. In contrast to conventional approaches, in one embodiment of the present invention, the transmit filter is selected by optimizing the autocorrelation coefficients via convex optimization methods, and then extracting filter coefficients from autocorrelation coefficients. The structure of the convez optimization allows for a Linear Programming (LP) solution. In the system of the present invention, transmit filter with thirty-two coefficients provides a power spectral density close to the maximum allowed.

BRIEF DESCRIPTION OF THE DRAWINGS

FIG. 2 is a diagram of the transmit path for the HDSL2 system.

FIG. 3 is a simplified transmit path emphasizing the transmit filter.

FIG. 5 are equations used in the convex optimization procedure.

FIG. 10 is a table illustrating the transmit filter coefficients for one embodiment of the present invention.

DETAILED DESCRIPTION OF THE PREFERRED EMBODIMENT

Figures 1A, 1B:
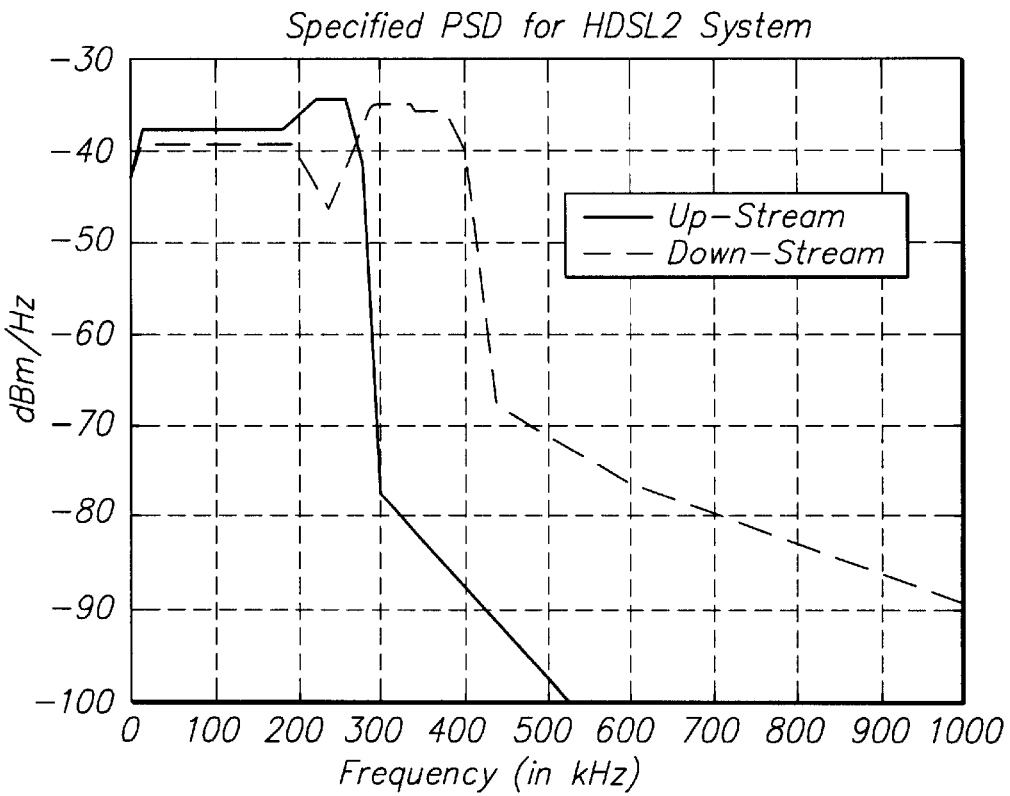
FIG. 1A is a table illustrating the upstream and downstream maximum power spectral density for the HDSL2 system, as specified in the HDSL2 standard.
FIG. 1B is a diagram of the maximum power spectral density for the HDSL2 system.

FIGS. 1A and 1B illustrate the PSD limitations of the HDSL2 system as specified in the HDSL2 standard. The present invention can also be used with other DSL specifications or with non-DSL communications specifications. FIG. 1A is a table illustrating the upstream and downstream maximal power spectral density. FIG. 1B is a graph illustrates both the upstream and downstream maximal PSDs. Note that the upstream PSD has a peak power at around 230 KHz and the downstream PSD has a peak power at around 350 KHz. The peaks of the upstream and downstream PSDs correspond to corresponding dips in the downstream and upstream PSDs, respectively, to avoid interference between the upstream and downstream signals.

FIG. 2 is a diagram of relevant elements of a DSL transmitter in one embodiment of the present invention. Up-sampler 22 up-samples the input signal by a factor of 2 using zero filling. The transmit filter 24 filters the signal such that the ultimate output is within the power spectral density of the specification. An up-sampler 26 then up-samples the system by a factor of 2 again, using zero filling. The digital low-pass filter 28 or interpolation filter (IF) then filters the output of the up-sampler 26. Sample-and-hold unit 30 is placed after the digital interpolation filter (IF) and models the effects of the Digital-to-Analog Converter (DAC). Finally, the analog low-pass filter (AF) 32 filters the output of the sample-and-hold (SH) to produce the output of the HDSL2 unit. The effects of all filters except the transmit filter can be modeled as a fixed frequency weighting function, W(f).

FIG. 3 is a simplified diagram with fixed elements 34 before the transmit filter and fixed elements 36 after the transmit filter. As will be described below, the system will meet the PSD requirements as long as $|W(f)H(f)|^2 \leq S_{max}(f)$, where $S_{max}(f)$ is the maximum allowable power.

Figure 4:
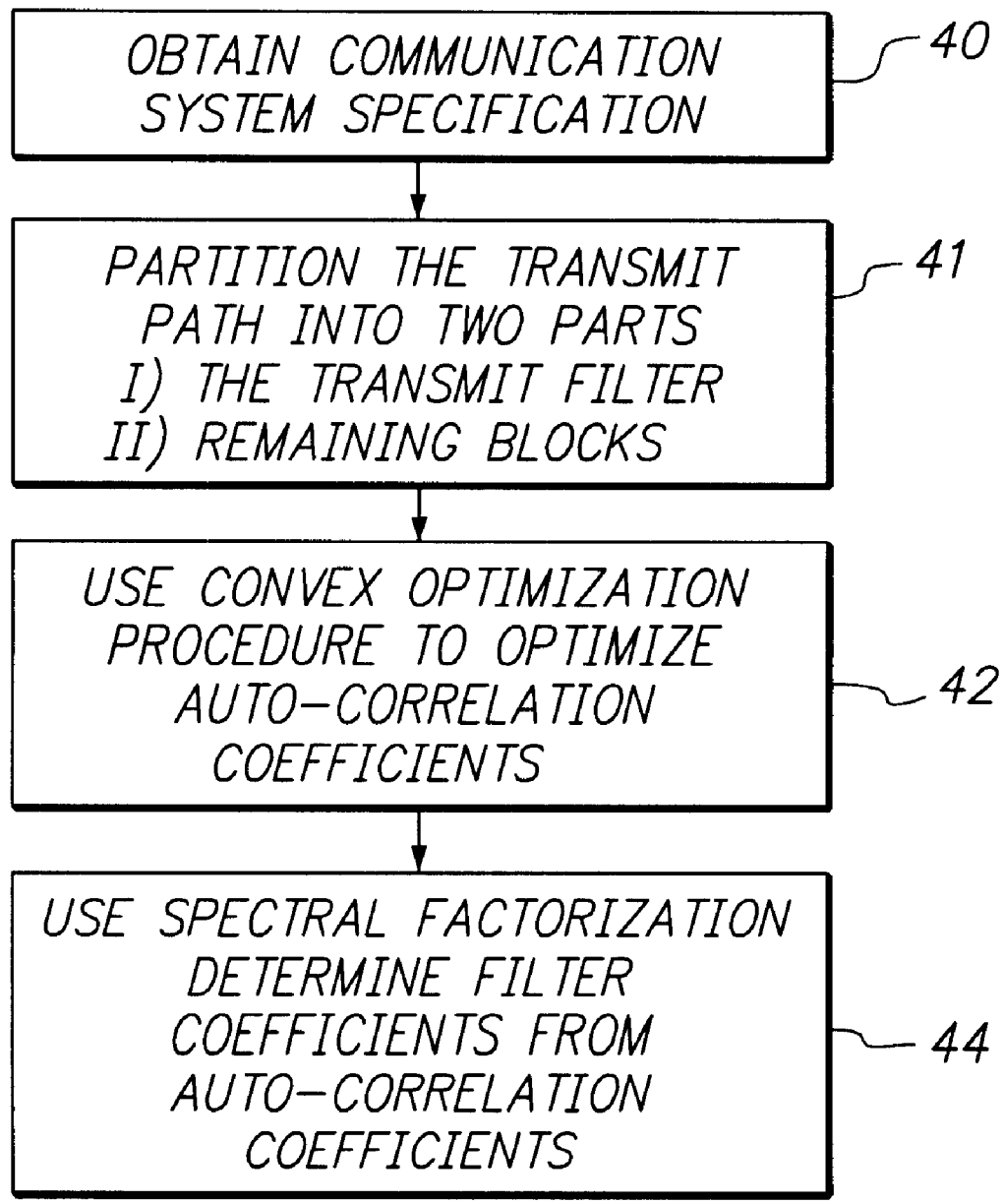
FIG. 4 is a flowchart illustrating the method of the present invention.

FIG. 4 is a flow chart that illustrates the system of the present invention. In step 40, a communication system specification is obtained. This communication system specification will have a power output limitations for different frequencies. In step 41, the transmit path is partitioned into the transmit filter and the other elements. In step 42, in a convex optimization procedure described below, the autocorrelation coefficients of the transit filter are optimized. In step 44, the filter coefficients are determined from the autocorrelation coefficients. A spectral factorization is preferably used to obtain the filter coefficients from the autocorrelation coefficients. Note that this for the HDSL2 systems the procedures can be done both for the upstream and downstream filters. The convex optimization procedure is described as follows:

Let $S_{max}(f)$ denote the specified maximum allowable power in Watts/Hz. Then $$|W(f)H(f)|^2 \leq S_{max}(f),$$

for all frequencies. W(f) can be thought of as a frequency domain weighting function for the contributions of the other elements in the transmit path besides the transmit filter.

Figure 9:
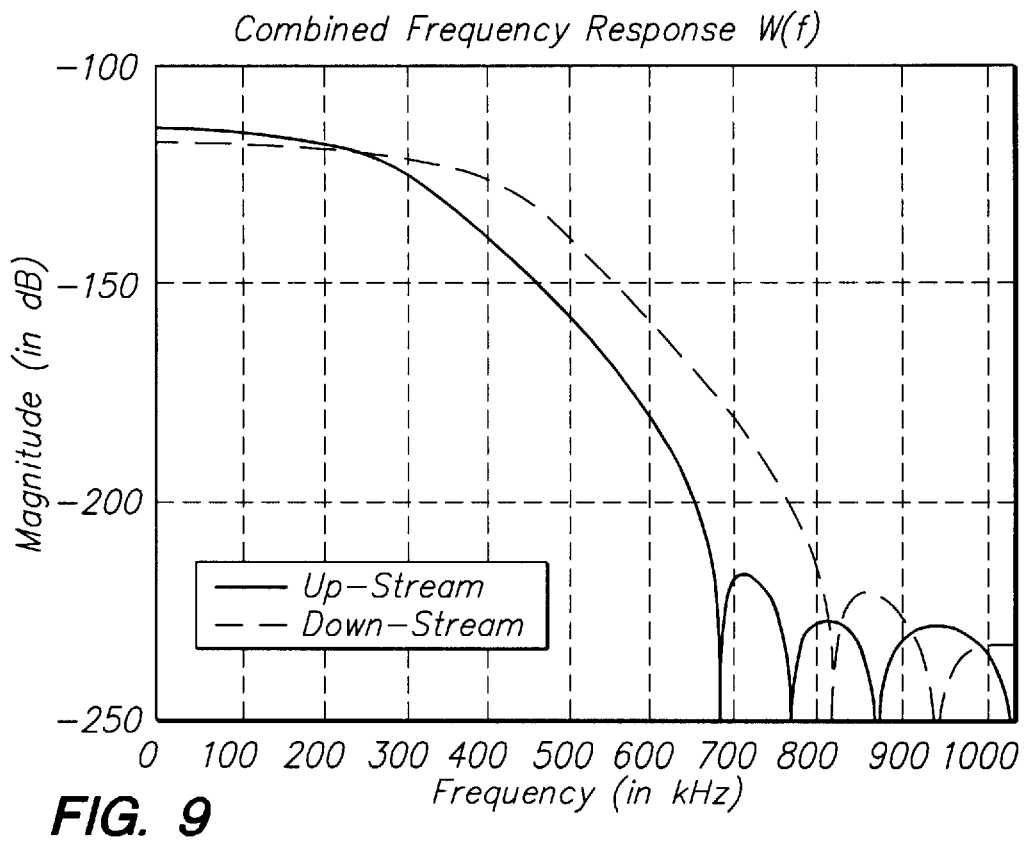
FIG. 9 is a diagram of the combined (IF, SH and AF) frequency response W(f) in one embodiment of the present invention.

For the example described below $$S_{x_7}(f) = \frac{2}{R_L f_s} |H_a(f) H_{sh}(f) H_1(f) H(f)|^2 |X_1(f)|^2 \leq S_{max}(f),$$

for all frequencies. And $$W(f) \triangleq \sqrt{\frac{2}{R_L f_s}} H_a(f) H_{sh}(f) H_1(f) X_1(f),$$

is the combined scaled frequency response of the transit path except the transmit filter. As will be described below, FIG. 9 shows the magnitude response of W(f) where we have assumed that $|X(f)|^2=1$; i.e., $X_1(f)$ is white which is true at the output of a precoder.

Now, we describe the optimization procedure for selecting the filter coefficients.

Let, $r(nT_2)$ be the autocorrelation coefficients associated with the filter impulse response $h(nT_2)$, i.e., $$r(nT_2) = \sum_{m=-N_{tap}+1}^{N_{tap}-1} h(mT_2)h((m+n)T_2),$$

for $n=-N_{tap}+1,-N_{tap}+2,\ldots,N_{tap}-1$. Let $$r \triangleq [r(0)\ r(T_2)\ \ldots\ r((N_{tap}-1)T_2)]^T,$$

be the autocorrelation vector. Then, we can write $$|H(f)|^2 = r(0) + \sum_{n=1}^{N} 2r(n)\cos(2\pi f n T_2),$$

where r(n) is the nth component of the vector r. Note that r(0) is the total power under the magnitude response $|H(f)|^2$. Thus, the filter design problem can be recast as the following optimization problem max$_r r(0)$, such that $|W(f)|^2 |H(f)|^2 \leq S_{max}(f)$.

The optimization problem can be written as finite dimensional linear programming (LP) if we use a discrete approximation of the upper bound constraint. We choose a set of N uniformly sampled frequencies $$f_k = \frac{k f_s}{2N}, k = 0, 1, \ldots, N-1,$$

and replace the upper bound constraint for all frequency by N inequality conditions as $|W(f_k)|^2 |H(f_k)|^2 \leq S_{max}(f_k)$, $k=0,1,\ldots,N-1$ For sufficiently large N this discretization yields a good approximation to the original upper bound condition. Using this discretization we rewrite the optimization problem as max$_r r(0)$, such that $|W(f_k)|^2 |H(f_k)|^2 \leq S_{max}(f_k)$, $k=0, 1, \ldots, N-1$.

To write the above problem as an LP, we define an $N \times N_{\theta_x}$ <matrix F, a size N diagonal matrix W and two vectors s (N×1) shown in the matrices of FIG. 5.

Using these matrices, we write the optimization problem as an LP $$\min_r c^T r, \text{ subject to } Ar \leq b$$

where $$A \triangleq \begin{bmatrix} WF \\ -WF \end{bmatrix}, b \triangleq \begin{bmatrix} s \\ 0 \end{bmatrix},$$

and 0 is a zero vector of compatible dimension (N×1). Note that we added a nonnegativity condition in the optimization problem. This is done so that the vector r have a spectral factor, i.e., $$r(0) + \sum_{n=1}^{N_{tap}-1} 2r(n)\cos(2\pi f n T_2) \geq 0,$$

for all frequencies. However, due to discretization this is not guaranteed.

We solve the LP to obtain the optimal auto-correlation vector r. Once such a vector is obtained, the filter coefficients are then computed using spectral factorization. For problems with small Nap$_{tap}$, spectral factors can be obtained via root-finding methods. For example, see X. Chen and T. Parks, "Design of optimal minimum phase FIR filters by direct factorization," Signal Processing, 10:369–383, 1986.

FIGS. 6–12 illustrate one embodiment of the system of the present invention.

The transmit path for the HDSL2 system with all the relevant components is shown in FIG. 2. The output of the precoder (not shown) $x_1(nT_1)$ is input to the up-sampler 22. The sample rate of the input signal R=517 ⅓ ksamples/sec ($T_1=1/R$ sec). Let $$X_1(f) \triangleq \sum_{n=-\infty}^{\infty} x_1(nT_1)\exp(-j2\pi f n T_1),$$

be the frequency response of the input signal $x_1(nT_1)$. This input signal if then up-sampled by a factor of 2 using zero-filling. Thus, the output of the up-sampler is given by $$x_2(nT_2) \triangleq \begin{cases} x_1(mT_1) & \text{if } n = 2m, \\ 0 & \text{otherwise,} \end{cases}$$

where $T_2=T_1/2$. In the frequency domain we have $$X_2(f) \triangleq \sum_{n=-\infty}^{\infty} x_2(nT_2)\exp(-j2\pi f n T_2),$$

$$= \sum_{n=-\infty}^{\infty} x_2(nT_1/2)\exp(-j2\pi f T_1/2),$$

$$= X_1(f).$$

The output of the up-sampler is then filtered by the transmit filter Txfil. Let the frequency response of the transmit filter be $$H(f) \triangleq \sum_{n=0}^{N_{tap}-1} h(nT_2)\exp(-j2\pi fnT_2),$$

where $h(nT_2), n=0,1,\ldots,N_{tap}-1$, are the filter coefficients and $N_{tap}$ is the maximum allowable number of taps. We need to design these coefficients such that the PSD of the output $x_7(t)$ satisfies the power requirements.

Using the filter response H(f), we write the output of the transmit filter in the frequency domain as $$X_3(f) \triangleq \sum_{n=-\infty}^{\infty} x_3(nT_2)\exp(-j2\pi fnT_2),$$
$$= H(f)X_2(f),$$
$$= H(f)X_1(f),$$

The output is then up-sampled again by a factor of 2 using zero-filling and the output of the second up-sampler is given by $$x_4(nT_3) \triangleq \begin{cases} x_2(mT_2) & \text{if } n = 2m, \\ 0 & \text{otherwise}, \end{cases}$$

where $T_3 = T_2/2 = T_s/4$, and in the frequency domain we have $$X_4(f) \triangleq \sum_{n=-\infty}^{\infty} x_4(nT_3)\exp(-j2\pi fnT_3),$$
$$= \sum_{n=-\infty}^{\infty} x_3(nT_2/2)\exp(-j2\pi fnT_2/2),$$
$$= H(f)X_1(f),$$
$$= X_3(f)$$

Figure 6:
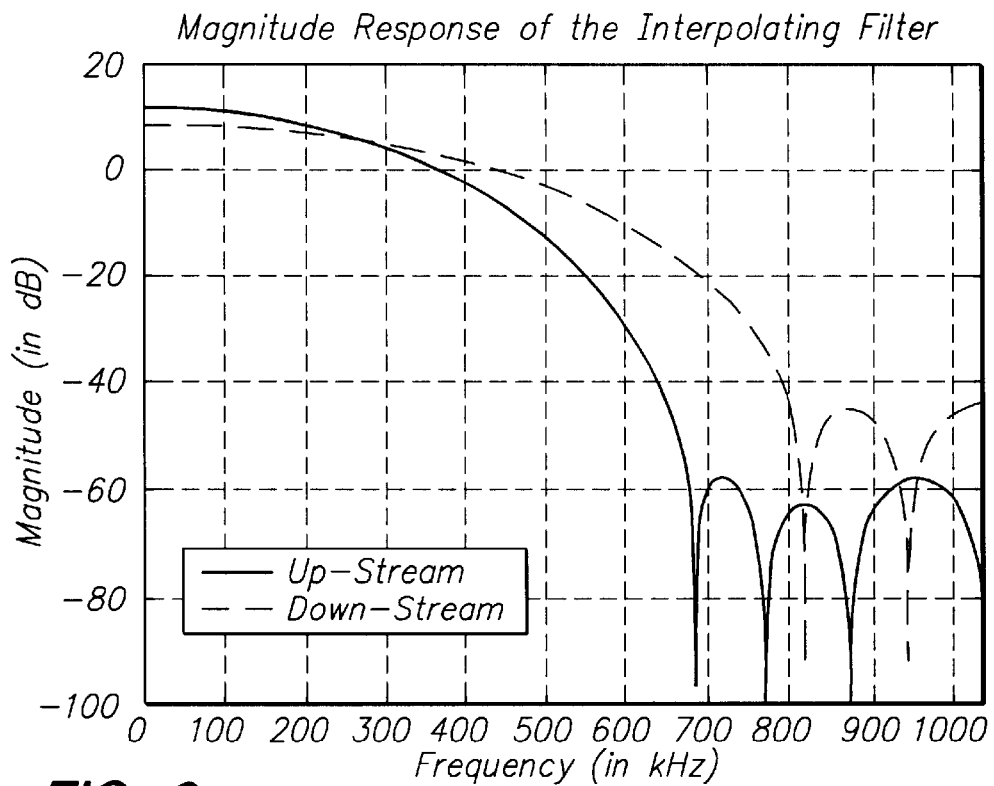
FIG. 6 is a diagram of one embodiment of the magnitude response of an interpolation filter (IF) which uses one embodiment of the present invention.

The output of the second up-sampler $x_4(nT_3)$ is filtered through an interpolating (low pass) filter $H_1(f)$ (which sits inside the FPGA). For the up-stream we have chosen an $8^{th}$ order interpolating filter with the following coefficients $h_1(nT_3)$=[0.052277 0.26772 0.6602 1 1 0.6602 0.26772 0.052277], and for the down-stream we have chosen a $5^{th}$ order interpolating filter with the following coefficients $h_1(nT_3)$=[0.19811 0.6949 1 0.6949 0.19811], The frequency response of these two filters are shown in FIG. 6. The output of the interpolating filter in the frequency domain is given by $$X_5(f) \triangleq \sum_{n=-\infty}^{\infty} x_5(nT_3)\exp(-j2\pi fnT_3),$$
$$= H_1(f)X_4(f),$$
$$= H_1(f)H(f)X_1(f),$$

The output of the interpolating filter is then passed through a sample and hold (S/H) circuit followed by an analog filter $H_a(f)$. The output of the S/H is given by $$x_6(t) \triangleq x_5(nT_3), \quad nT_3 \le t < (n+1)T_3.$$

Thus, $$X_6(f) \triangleq \int_{-\infty}^{\infty} x_6(t)\exp(-j2\pi ft)dt,$$
$$= \sum_{n=-\infty}^{\infty} \int_{nT_3}^{(n+1)T_3} x_6(t)\exp(-j2\pi ft)dt,$$
$$= \sum_{n=-\infty}^{\infty} \int_{nT_3}^{(n+1)T_3} x_5(nT_3)\exp(-j2\pi ft)dt,$$

Where we have defined $$H_{sh} \triangleq T_3\exp(-j\pi fT_3)\frac{\sin(\pi fT_3)}{\pi fT_3} = T_3\exp(-j\pi fT_3)\text{sinc}(fT_3),$$

Figure 7:
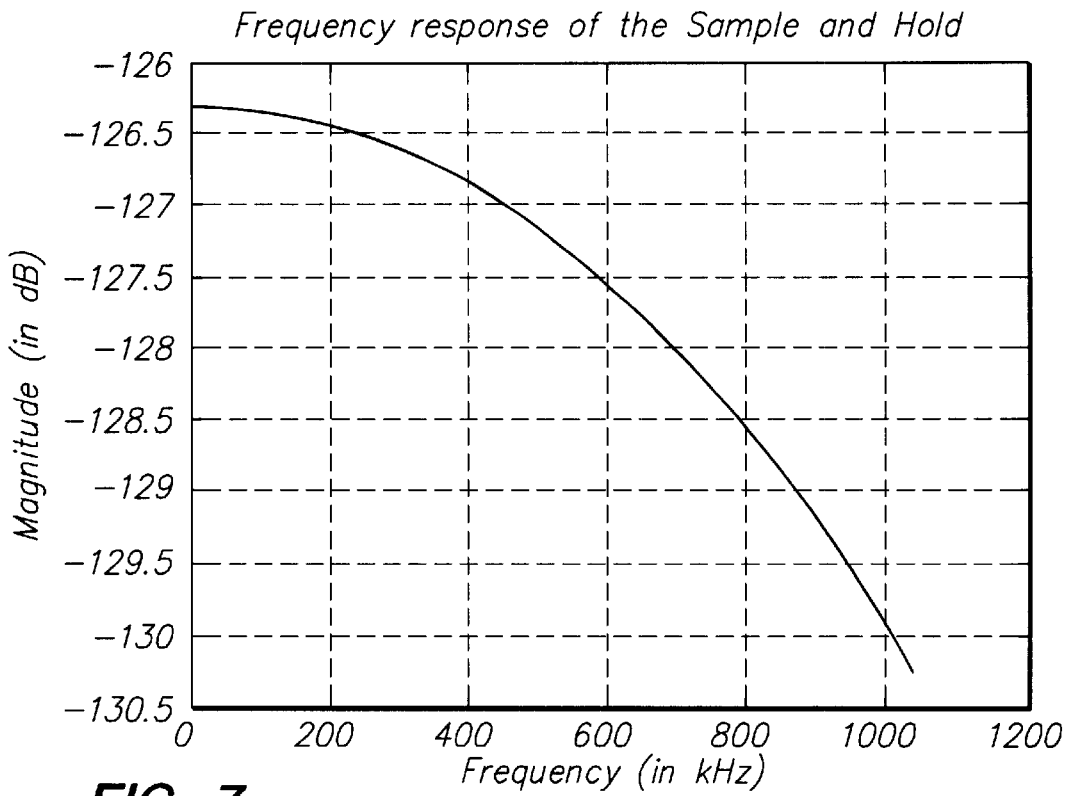
FIG. 7 is a diagram of the response of a sample-and-hold (SH) element used in one embodiment of the present invention.

The magnitude plot the function $H_{sh}$ is shown in FIG. 7. Now, we write $$X_6(f) = H_{sh}H_1(f)H(f)X_1(f).$$

$$= \sum_{n=-\infty}^{\infty} x_5(nT_3) \int_{nT_3}^{(n+1)T_3} \exp(-j2\pi ft)dt,$$
$$= \left[\sum_{N=-\infty}^{\infty} x_5(nT_3)\exp(-j2\pi fnT_3)\right]\frac{1-\exp(-j2\pi fT_3)}{j2\pi f}$$
$$= X_5(f)T_3\exp(-j\pi fnT_3)\frac{\sin(\pi fT_3)}{\pi fT_3},$$
$$= X_5(f)H_{sh}(f),$$

For the analog filter $H_a(f)$. We have chosen a $4^{th}$ order Butterworth filter with cut-off frequency $f_c$=300 kHz for the up-stream and an $8^{th}$ order Butterworth filter with cut-off frequency $f_c$=440 kHz kHz for the down-stream. The squared magnitude response of an Nth order Butterworth filter with cut-off frequency $f_c$ is given by $$|H_a(f)|^2 = \frac{1}{1+(f/f_c)^{2N}}.$$

Figure 8:
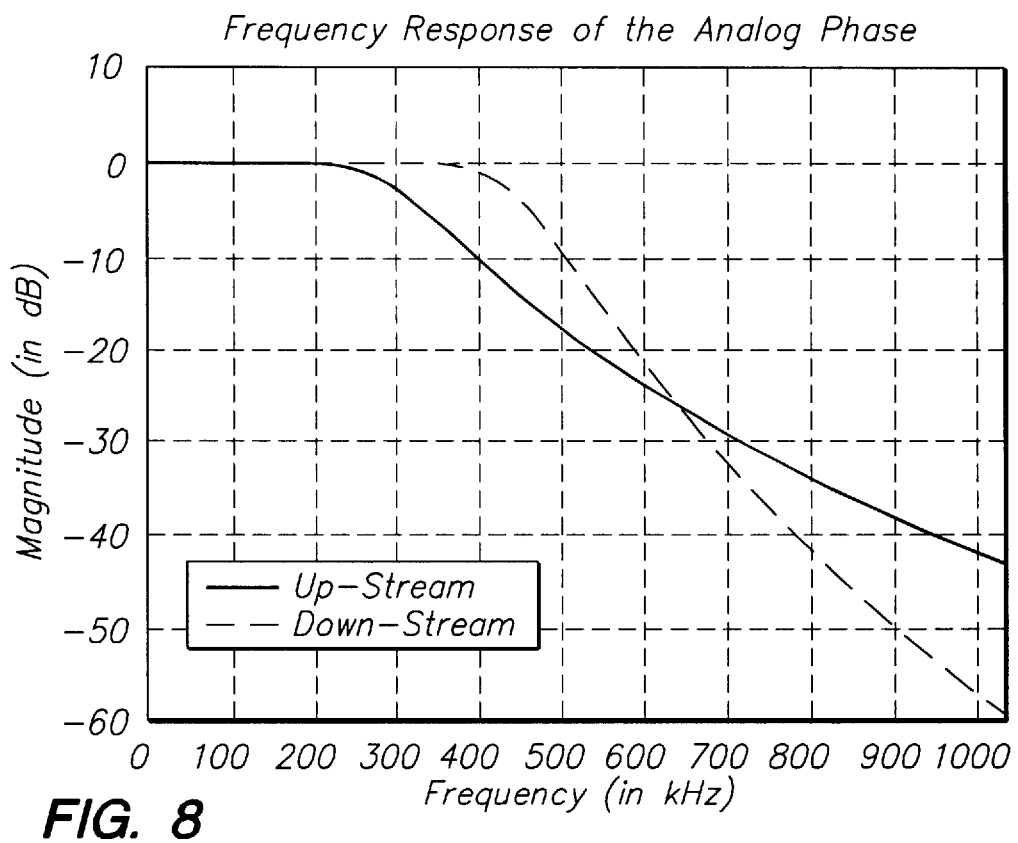
FIG. 8 is a diagram of the frequency response of the analog filters (AF) used in one embodiment of the present invention

The magnitude response of the up-stream and down-stream analog filters are shown in FIG. 8.

Finally, the frequency response of $x_7(t)$, the output of the analog filter $H_a(f)$ is given by $$X_7(f) \triangleq \int_{-\infty}^{\infty} x_7(t)\exp(-j2\pi ft)dt,$$
$$= H_a(f)X_6(f),$$
$$= H_a(f)H_{sh}(f)H_1(f)H(f)X_1(f),$$

The HDSL2 standard specifies the PSD of $x_7(t)$ in terms of dBm/Hz and the power is measured with a load impedance of $R_L$=135Ω. Now the one-sided PSD $S_{x_7}(f)$ and the magnitude response $X_7(f)$ are related as follows $$S_{x_7}(f) = \frac{2}{R_L f_s}|X_7(f)|^2,$$

where $f_s$ is the sampling frequency in Hz. Thus, $$S_{x_7}(f) = \frac{2}{R_L f_s}|H_a(f)H_{sh}(f)H_1(f)H(f)|^2|X_1(f)|^2.$$

Using the techniques described above, a thirty-two coefficient digital transmit filter for the upstream and downstream directions are shown in the Table of FIG. 10.

Figure 11:
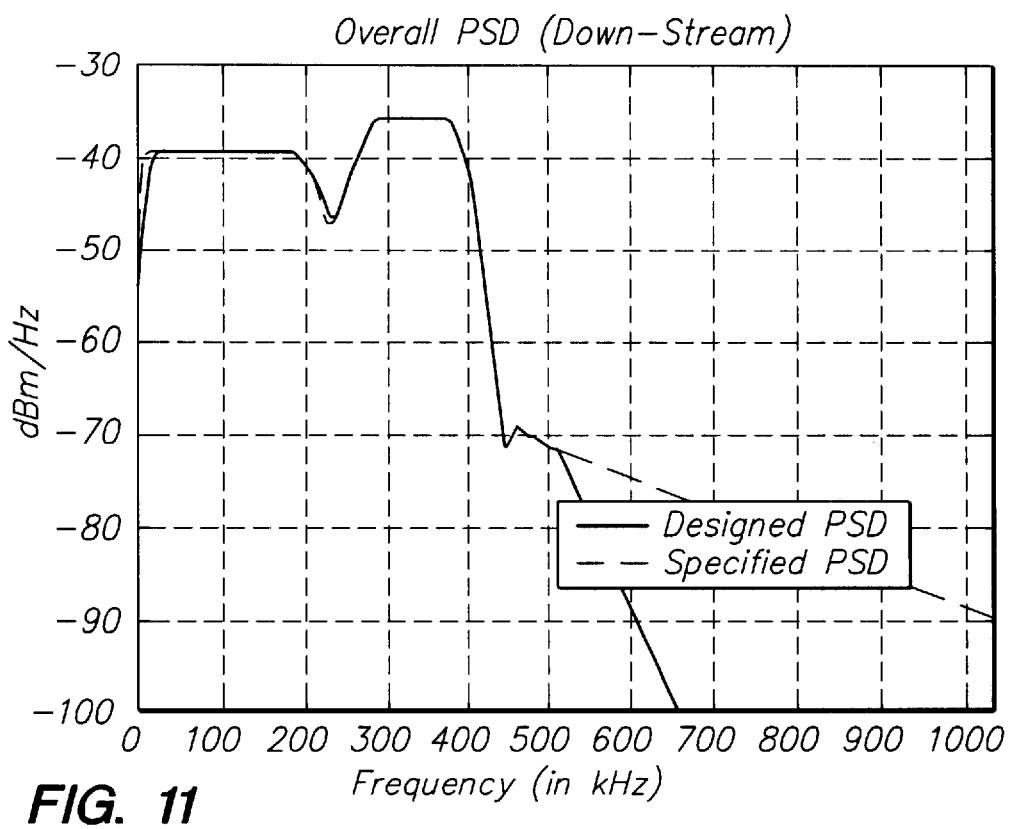
FIG. 11 is a diagram that illustrates the downstream PSD.

FIG. 11 illustrates the overall downstream design PSD and specification PSD, assuming $|X(f)^2=1$.

Figure 12:
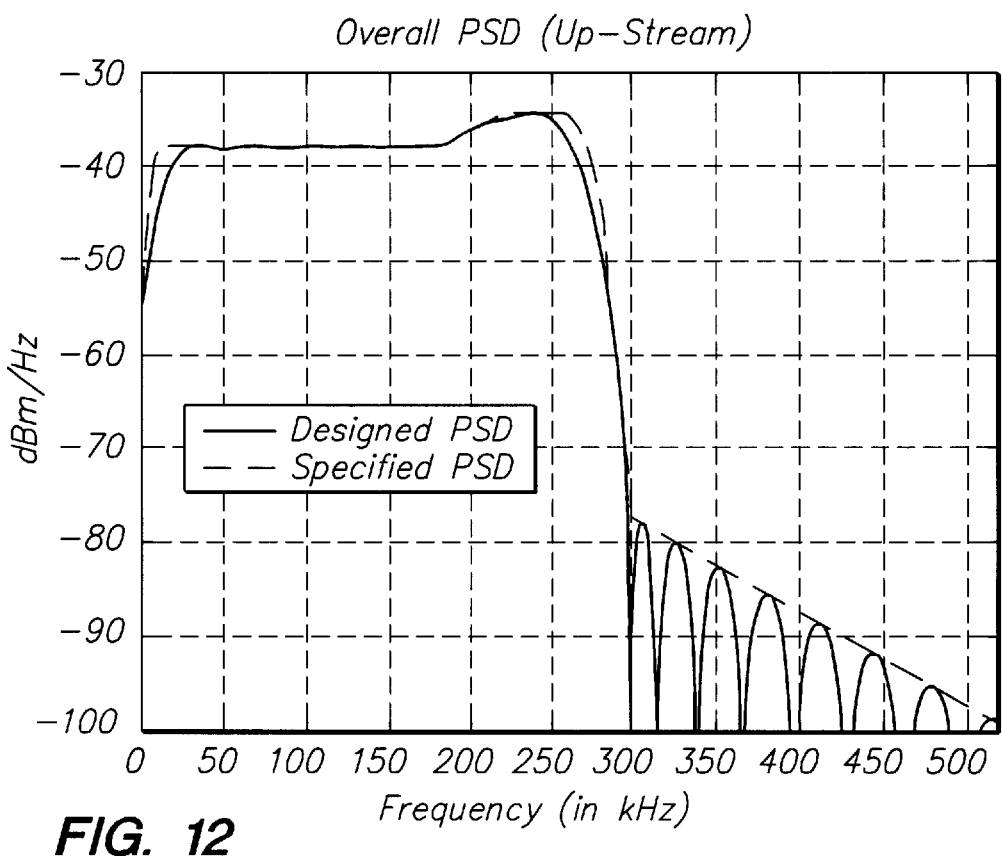
FIG. 12 is a diagram that illustrates the upstream PSD.

FIG. 12 illustrates both the designed and specified overall upstream power spectral densities.

Note that the transmit filter coefficients depend upon the other elements in the transmit path since the other elements affect the W(f) frequency domain weighting function. Thus, for example, if a different interpolating filter were used, the coefficients of the transmit filter would have to be modified.

It will be appreciated by those of ordinary skill in the art that the invention can be implemented in other specific forms without departing from the spirit or character thereof. The presently disclosed embodiments are therefore considered in all respects to be illustrative and not restrictive. The scope of the invention is illustrated by the appended claims rather than by the foregoing description, and all changes that come within the meaning and range of equivalents thereof are intended to be embraced herein.

What is claimed is:

1. A digital transmit filter for a communication system having a maximum prescribed output power spectral density, the digital transmit filter having filter coefficients selected such that the output power spectral density of the system is below the maximum output power spectral density of the communication system, the filter coefficients being selected from optimized autocorrelation coefficients for the filter in a convex optimization procedure.

2. The digital transmit filter of claim 1 wherein spectral factorization is used to determine the filter coefficients from the autocorrelation coefficients.

3. The digital transmit filter of claim 2 wherein spectral factors of the spectral factorization are found using a root finding method.

4. The digital transmit filter of claim 1 wherein the system includes an interpolating filter that affects affects the total output power spectral density of the system.

5. The digital transmit filter of claim 1 wherein a discrete approximization of an upper bound constraint is done in the convex optimization procedure.

6. The digital transmit filter of claim 1 wherein the digital transmit filter is implemented with different coefficients for upstream and downstream directions.

7. The digital transmit filter of claim 1 wherein the digital transmit filter has fewer than one hundred coefficients.

8. The digital transmit filter of claim 1 wherein the digital transmit filter has thirty-two or fewer coefficients.

9. A method of determining filter coefficients for a digital transmit filter of a communication system having a maximum prescribed output power spectral density, comprising optimizing autocorrelation coefficients for the digital transmit filter in a convex optimization procedure; and determining the filter coefficients from the autocorrelation coefficients.

10. The method of claim 9 wherein the filter coefficients are determined from the autocorrelation coefficients using spectral factorization.

11. The method of claim 10 wherein the spectral factorization is done using a root finding method.

12. The method of claim 9 wherein a discrete approximization of an upper bound constraint of the autocorrelation coefficients is done in the convex optimization procedure.

13. The method of claim 9 wherein the digital transmit filter is for a DSL system.

14. The method of claim 13 wherein the digital transmit filter is for a high-bit DSL system.

15. The method of claim 9 wherein the digital transmit filter has fewer than one hundred coefficients.

16. The method of claim 9 wherein the digital transmit filter has thirty-two or fewer coefficients.

* * * * *